(12) United States Patent
Saydam et al.

(10) Patent No.: US 7,094,069 B1
(45) Date of Patent: Aug. 22, 2006

(54) SEAL MEMBER LIMITING SOLDER FLOW

(75) Inventors: Erol D. Saydam, Foster, RI (US);
Curtis Wilmot, Warwick, RI (US);
Glenn Goodman, Cumberland, RI
(US); Richard J. Alviti, Cranston, RI
(US)

(73) Assignee: Advanced Interconnections Corporation, West Warwick, RI (US)

( * ) Notice: Subject to any disclaimer, the term of this patent is extended or adjusted under 35 U.S.C. 154(b) by 0 days.

(21) Appl. No.: 11/211,258

(22) Filed: Aug. 24, 2005

(51) Int. Cl.
*H01R 12/00* (2006.01)
*H05K 1/00* (2006.01)

(52) U.S. Cl. ........................... 439/70; 439/591

(58) Field of Classification Search ............ 439/70, 439/591, 66
See application file for complete search history.

(56) References Cited

U.S. PATENT DOCUMENTS

| | | | |
|---|---|---|---|
| 5,742,481 A | 4/1998 | Murphy et al. | 361/767 |
| 5,877,554 A | 3/1999 | Murphy | 257/727 |
| 5,917,703 A | 6/1999 | Murphy | 361/704 |
| 6,020,635 A | 2/2000 | Murphy | 257/727 |
| 6,198,630 B1* | 3/2001 | Cromwell | 361/704 |
| 6,256,202 B1 | 7/2001 | Murphy | 361/704 |
| 6,313,530 B1 | 11/2001 | Murphy | 257/727 |
| 6,325,280 B1 | 12/2001 | Murphy | 228/246 |
| 6,394,820 B1* | 5/2002 | Palaniappa et al. | 439/83 |
| 6,776,624 B1* | 8/2004 | Suematsu | 439/71 |

* cited by examiner

*Primary Examiner*—Hae Moon Hyeon
(74) *Attorney, Agent, or Firm*—Fish & Richardson P.C.

(57) ABSTRACT

An intercoupling component is of the type used to couple an array of electrical connection regions disposed on a first substrate to an array of electrical connection regions disposed on a second substrate. The intercoupling component comprises: an insulative support member; a plurality of electrically conductive terminal elements; a second insulative support member; and a seal member positioned between the first insulative support member and the second insulative member to restrict fluid flow along the terminal elements.

26 Claims, 4 Drawing Sheets

SEAL MEMBER LIMITING SOLDER FLOW

TECHNICAL FIELD

This invention relates to making connections between integrated circuit array packages and circuit boards, and more particularly to intercoupling components for making such connections.

BACKGROUND

Ball grid array (BGA) packages are becoming increasingly popular because of their low profiles and high densities. With a BGA package, for example, the rounded solder balls of the BGA are generally soldered directly to corresponding surface mount pads of a printed circuit board rather than to plated thru-holes which receive pins from, for example, a pin grid array (PGA) IC package.

Sockets allow particular IC packages to be interchanged without permanent connection to a circuit board. More recently, sockets for use with BGA packages have been developed to allow these packages to be non-permanently connected (e.g., for testing) to a circuit board. Such sockets can be attached to circuit boards at connection points that mirror those of the BGA packages that the sockets are used with. However, problems can exist in attaching a socket to a circuit board using reflowable substances.

SUMMARY

This invention features an intercoupling component of the type used to couple an array of electrical connection regions disposed on a first substrate (e.g., a BGA package) to an array of electrical connection regions disposed on a second substrate (e.g., a printed circuit board). The intercoupling component includes a seal member which limits the flow of fluids (e.g., molten solder) into the intercoupling component. This can improve the reliability of the electrical connection provided by the intercoupling component.

The intercoupling component can include two sheets of insulative material which are stiffer than the seal with the seal member located between them. Alternatively, the intercoupling component can include a single sheet of insulative material which is stiffer than the seal member with the seal member located on or near a face of the insulative material.

An aspect of the invention features an intercoupling component is of the type used to couple an array of electrical connection regions disposed on a first substrate to an array of electrical connection regions disposed on a second substrate. The intercoupling component includes: an insulative support member having a first upper surface and an opposite first lower surface, the support member including an array of first holes extending transversely from the first upper surface to the opposite first lower surface, the array of first holes located in a pattern corresponding to the array of the electrical connection regions of the first substrate; a plurality of electrically conductive terminal elements, press-fit within the first holes and configured to electrically connect the array of connection regions of the first substrate to the array of connection regions of the second substrate; a second insulative support member having a second upper surface, an opposite second lower surface and a first stiffness characteristic, the second insulative support member including an array of second holes extending transversely from the second upper surface to the opposite second lower surface, the array of second holes receiving the plurality of electrically conductive terminal elements; and a seal member positioned between the first insulative support member and the second insulative member, the seal member having a third upper surface, an opposite third lower surface and a second stiffness characteristic less than the first stiffness characteristic, the seal member including an array of third holes extending transversely from the third upper surface to the opposite third lower surface, the array of third holes receiving the plurality of electrically conductive terminal elements and sized and shaped to restrict fluid flow along the terminal elements.

Another aspect features a method of manufacturing an intercoupling component of the type used to couple an array of electrical connection regions disposed on a first substrate to an array of electrical connection regions disposed on a second substrate. The method includes: providing an array of first holes extending through a first insulative support member, the array of first holes located in a pattern corresponding to the array of the electrical connection regions of the first substrate; providing an array of second holes extending through a second insulative support member having a first stiffness characteristic, the array of second holes located in a pattern corresponding to the array of the electrical connection regions of the first substrate; providing an array of third holes extending through a seal member, the seal member having a second stiffness characteristic less than the first stiffness characteristic; positioning electrically conductive terminal elements within the first holes, the electrically conductive terminal elements configured to electrically connect the array of connection regions of the first substrate to the array of connection regions of the second substrate; and inserting the terminal elements through the third holes and the second holes such that the seal member is positioned between the first insulative support member and the second insulative member with the array of third holes sized and shaped to restrict fluid flow along the terminal elements.

Embodiments of these aspects of the invention may include one or more of the following features. In some embodiments, each terminal element includes solder preattached to an end of the terminal element. The solder can include a solder ball adapted to be reflowed to connect the terminal element to a corresponding one of the array of connection regions disposed on the second substrate.

In some embodiments, the seal member is formed of an insulative material and or can include a polyimide film. In some embodiments, the seal member is thermally-stable at temperatures below 400 degrees Centigrade and/or is substantially non-porous.

In some embodiments, the seal member includes a plurality of seals. Each seal can have third holes corresponding to a subset of the first holes. Similarly, each of the plurality of seals can have an annular shape.

In some embodiments, the first holes are sized to allow an end of the terminal elements to be press-fit into the first insulative support member. The first holes can have a diameter of less than about 0.020 inch (0.508 millimeters) and/or can be located with a pitch of between about 0.019 inch (0.500 millimeters) and 0.050 inch (1.27 millimeters). The second holes can have a first diameter that is greater than or equal to a second diameter of the third holes.

In some embodiments, the first insulative support member includes a first epoxy impregnated laminate with a first thickness and the second insulative support member includes a second epoxy impregnated laminate with a second thickness. The first thickness can be more than the second thickness. The first thickness can be between about 0.025 inch (0.635 mm) and 0.100 inch (2.54 mm) (e.g., 0.062 inch (1.57 millimeters)). The second thickness can be between about 0.005 inch (0.127 mm) and 0.025 inch (0.635 mm) (e.g., 0.015 inch (0.380 mm)).

In some embodiments, providing the second holes comprises machining the third holes to have a first diameter that is equal to or less than a second diameter of the second holes. For example, machining the third holes can include machining the third holes to have a first diameter of less than about 0.020 inch (0.508 mm).

In some embodiments, providing the array of third holes comprises drilling holes extending through a polyimide film (e.g., polyimide film that has a third thickness that is between about 0.004 inch (0.102 mm) and 0.006 inch (0.152 mm). Inserting the terminal elements through the third holes can include engaging sides of the terminal elements with portions of the seal member defining the third holes.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
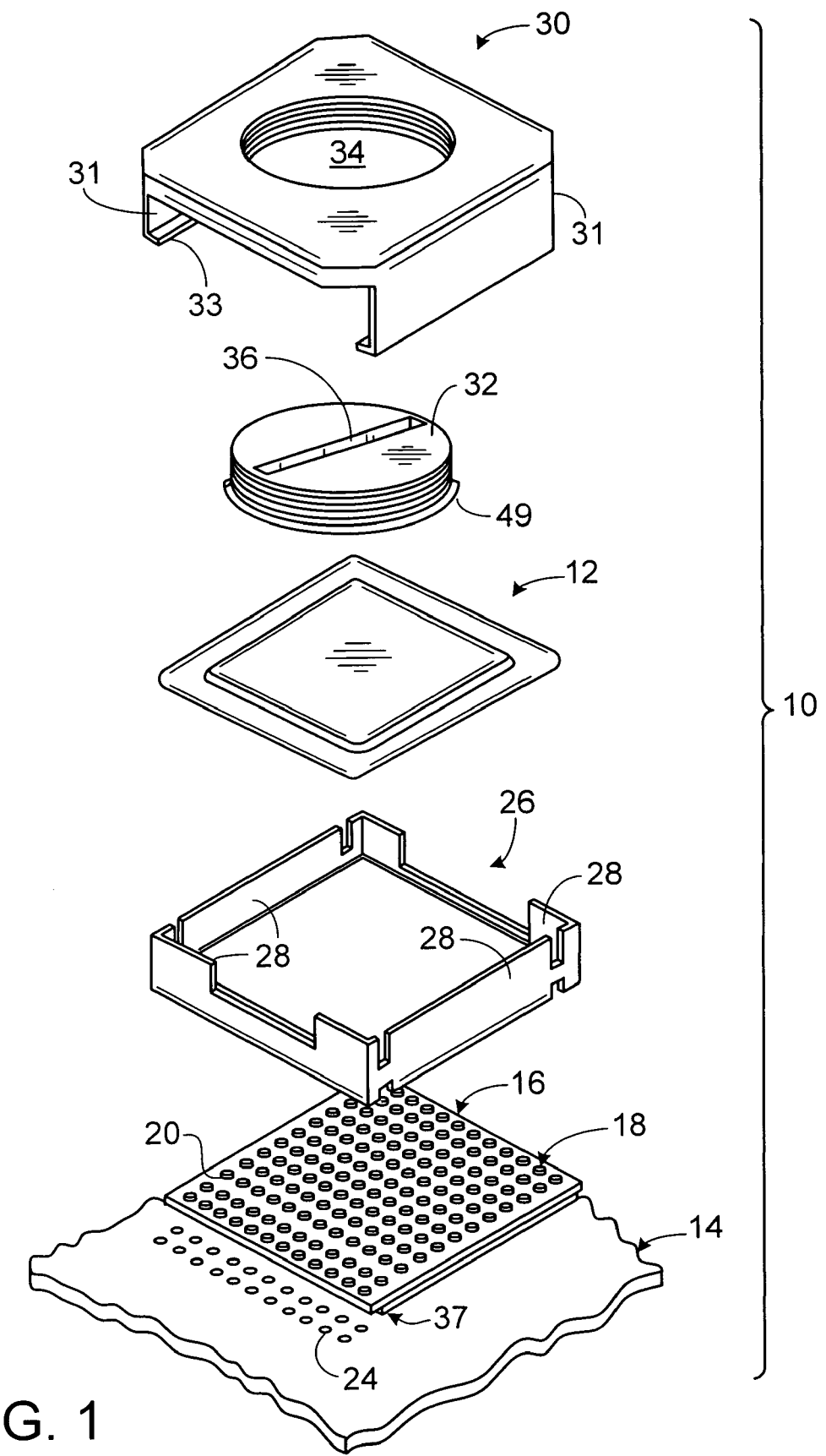
FIG. 1 is an exploded perspective view of intercoupling component of the type used to couple a printed circuit board to a BGA package.
Figure 2:
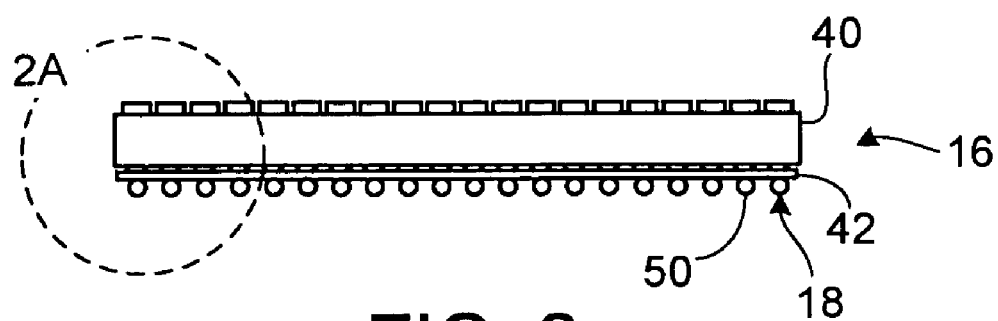
FIG. 2 is a side view of the intercoupling component of FIG. 1.

Referring to FIGS. 1 and 2, a BGA socket converter assembly 10 for intercoupling a BGA package 12 to a printed circuit board 14 is shown. BGA socket converter assembly 10, serving as an intercoupling component, includes an electrically insulative member 16 for supporting converter socket terminals 18, each of which is press-fit within a corresponding one of an array of holes 20 in the insulative member.

The array of holes 20 are provided in a pattern corresponding to a footprint of rounded solder balls of BGA package 12 as well as a footprint of surface mount pads 24 of printed circuit board 14. Other embodiments include electrical connection regions other than surface mount pads on substrates other than printed circuit boards (e.g., flexible circuits or test boards). Insulative member 16 with converter socket terminals 18 is press-fit into a guide box 26 having sidewalls 28 along which the peripheral edges of BGA package 12 are guided so that solder balls of the BGA package are aligned over converter socket terminals 18. Insulative member 16 and guide box 26 may be formed as a one-piece, integral unit.

As shown in FIG. 1, BGA socket converter assembly 10 also includes a hold-down cover 30 for securing the BGA package 12 into the socket converter assembly. Cover 30 includes a pair of opposite walls 31 having tab members 33 which engage recessed portions 37 along the underside of the insulative member 16. Hold-down cover 30 includes a threaded thru-hole 34 which threadingly receives a heat sink 32 to provide a thermal path for dissipating heat from the IC device generated within BGA package 12. Heat sink 32 is inserted and backed-in from the bottom of the cover 30 and includes a lip 49 which engages a flat counter-bored surface (not shown) on the bottom surface of the cover to ensure that the heat sink will contact the surface of the BGA package. A slot 36 formed in the heat sink facilitates threading the heat sink within the cover, for example, with a screwdriver or coin. Other latching mechanisms (e.g., clips or catches) may also be used to secure BGA packages within the socket converter assembly. It is also appreciated that other heat sink arrangements, including those with increased surface area (e.g. heat sinks with finned arrangements), may be substituted for the lower profile version shown in FIG. 1. In some applications, a heat sink may not be required with only the cover providing the downward compressing force to the BGA package.

Figure 2A:
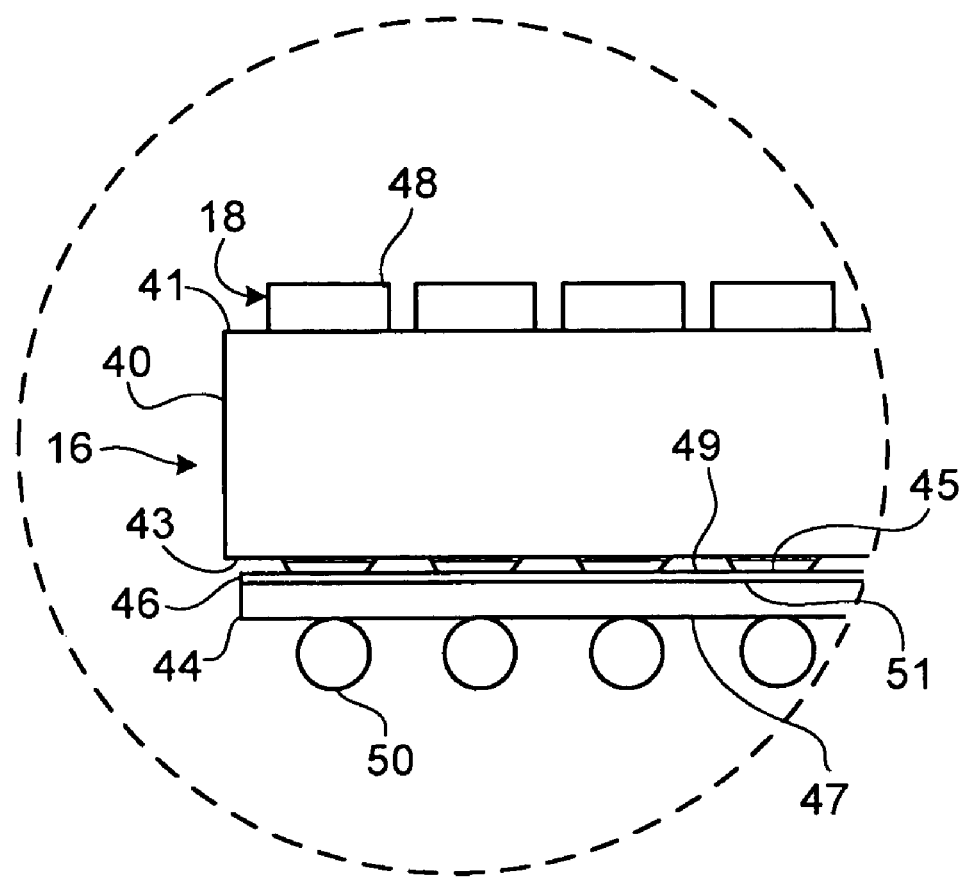
FIG. 2A is an expanded side view of a portion of the intercoupling component of FIG. 2.
Figure 3:
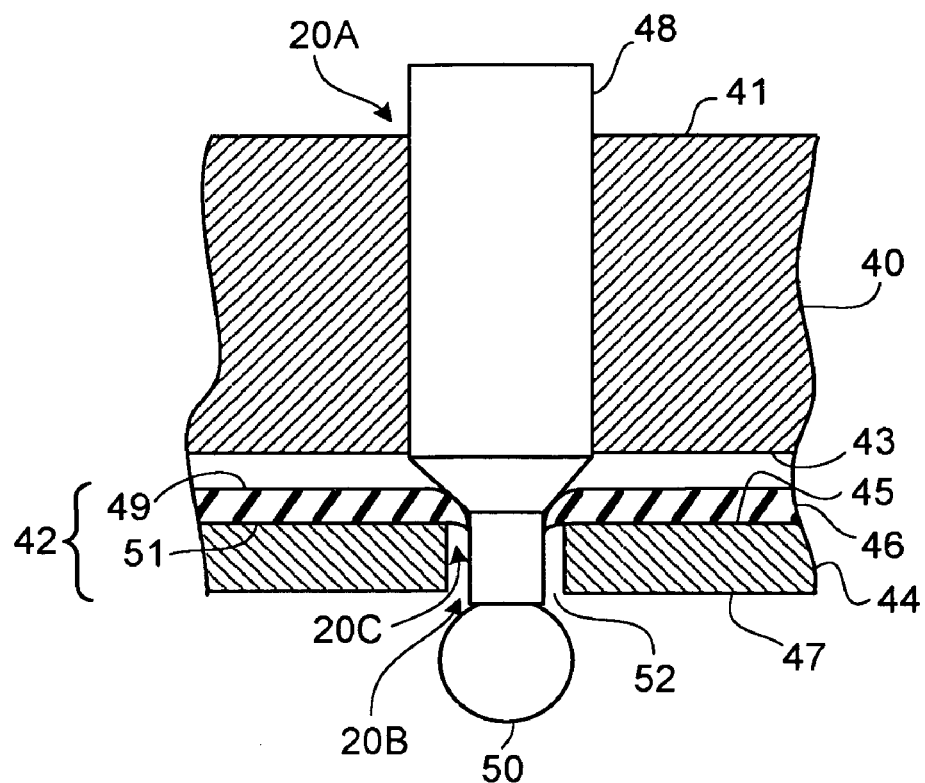
FIG. 3 is a cross-sectional view of a socket terminal extending through a portion of the intercoupling component of FIGS. 1 and 2.

Referring to FIGS. 2, 2A, and 3, the insulative member 16 includes a primary support member 40 and a seal 42. The seal 42 includes a secondary support member 44 and a seal member 46. The support members 40, 44 and seal member 46 have matching holes 20A, 20B, 20C located in a pattern that corresponds to the footprint of surface mount pads 24 of printed circuit board 14. The holes 20A in the primary support member extend from its upper surface 41 through the primary support member to its lower surface 43. Similarly, the holes 20B in the secondary support member 44 extend from its upper surface 45 to its lower surface 47 and the holes 20C in the seal member 46 extend from its upper surface 49 to its lower surface 51. The terms "upper" and "lower" are used here and throughout this document for descriptive purposes rather than to imply any absolute relative orientation.

The primary support member 40 and the seal 42 can be spaced apart as shown. In other embodiments, the seal 42 abuts the primary support member 40. The relative location of the primary support member 40 and the seal 42 is maintained by the converter socket terminals 18.

The primary support member 40 is made of a material that is substantially non-conductive to electricity (e.g. having resistivity greater than about 200K Mohms), has high-temperature resistance, is stable, and is inert. Appropriate materials include, for example, commercially available glass epoxy laminates. The thickness of the primary support member 40 is selected based on the required support and the characteristics of the material used to construct the primary support member 40. A related factor is that it is desirable to limit the space requirements of the overall intercoupling component, and, thus, the thickness of the primary support member 40.

Both the secondary support member 44 and the seal member 46 are also made of materials that are substantially nonconductive to electricity. The seal member 46 is configured to restrict fluid flow (e.g. the flow of molten solder) upwards along the socket terminals 18. The secondary support member 44 supports the seal member 46 and provides a level surface through which the solder balls 50 of the socket terminals extend. The seal member 46 is made of a material (e.g. a polyimide film) that has a stiffness characteristic less than the stiffness characteristic of the material (e.g. FR4) of the secondary support member 44 (i.e. the seal member is more flexible than the secondary support member 44). It is also preferable that the secondary support member 44 be visually distinct from solder.

The aligned holes 20A, 20B, 20C receive the converter socket terminals 18 which extend through both the primary support member 40 and the seal 42. The holes 20C are sized with a diameter that is slightly smaller than the diameter of the matching portion of the socket terminal 18. Thus, when a socket terminal 18 is inserted into a hole 20C, the seal member 46 flexes and the hole 20C expands slightly such that the seal member engages the sides of the socket terminal.

The seal 42 restricts fluid flow along the converter socket terminals 18 which extend through both the primary support member 40 and the seal 42. For example, molten solder can have a tendency to "wick" along outer surfaces of the converter socket terminals 18 when the solder balls 50 are heated to attach the socket terminal assembly 10 to the printed circuit board 14. When this occurs, flow of the solder into and/or through the primary support member 40 can result in a loss of electrical contact between individual socket terminals 18 and the underlying surface mount pads 24. By restricting fluid flow along the converter socket terminals 18, the seal 42 helps limit such "wicking" and, thus, maintain the desired electrical contact between the converter socket terminals 18 and the underlying surface mount pads 24. As the seal member can come in contact with molten solder, it is desirable that the seal member be thermally-stable at temperatures below 400 degrees Centigrade.

Figure 4:
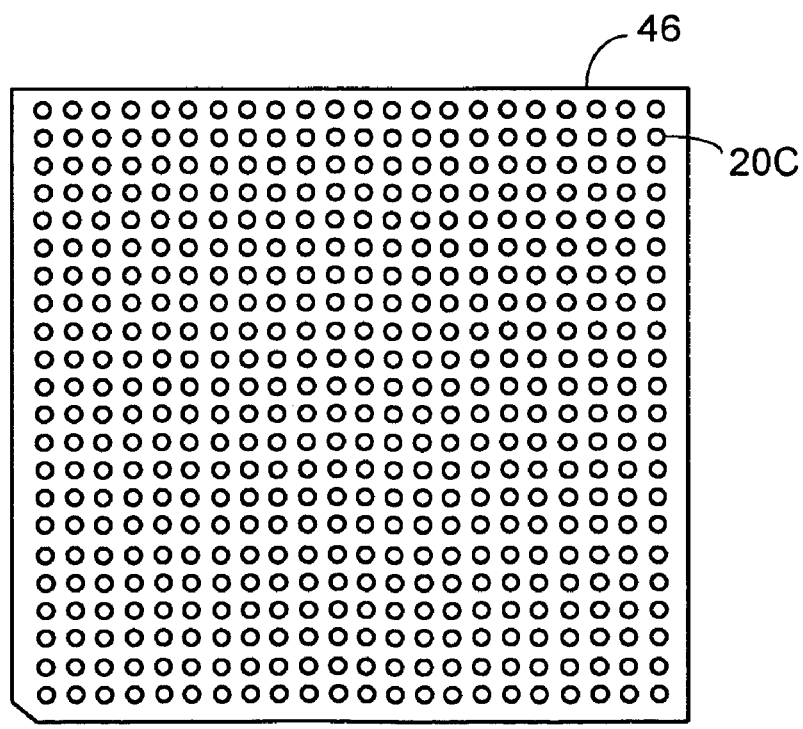
FIG. 4 is a plan view of a seal member.

Now referring to FIG. 4, in the exemplary embodiment, the seal member 46 is made of a single sheet of polyimide defining the 484 (22×22) array of holes 20C. By limiting "wicking" of solder along the socket terminals 18, the seal member 46 allows the holes 20A, 20B through the support members 40, 44 to be sized to compensate for positional and machining tolerances in the location and sizing of both the holes 20A, 20B and the socket terminals 18. This is thought to reduce the physical stresses on the insulative member 16 (particularly the support members 40, 44) that occur as the socket terminals are inserted through the holes 20.

Figure 5:
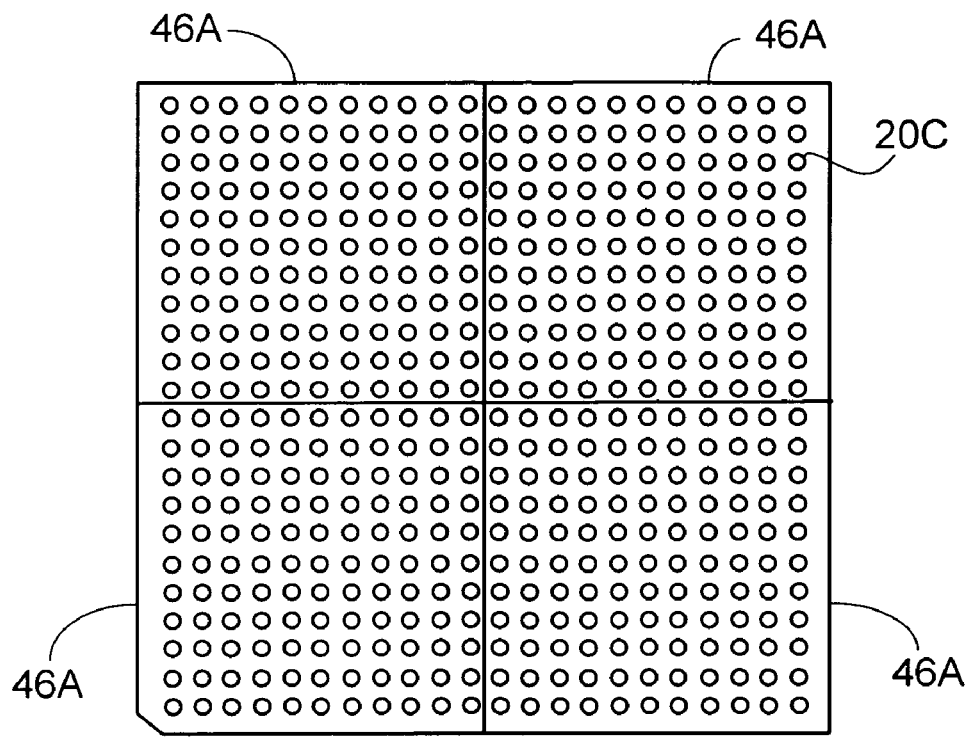
FIG. 5 is a plan view of another seal member.
Figure 6:
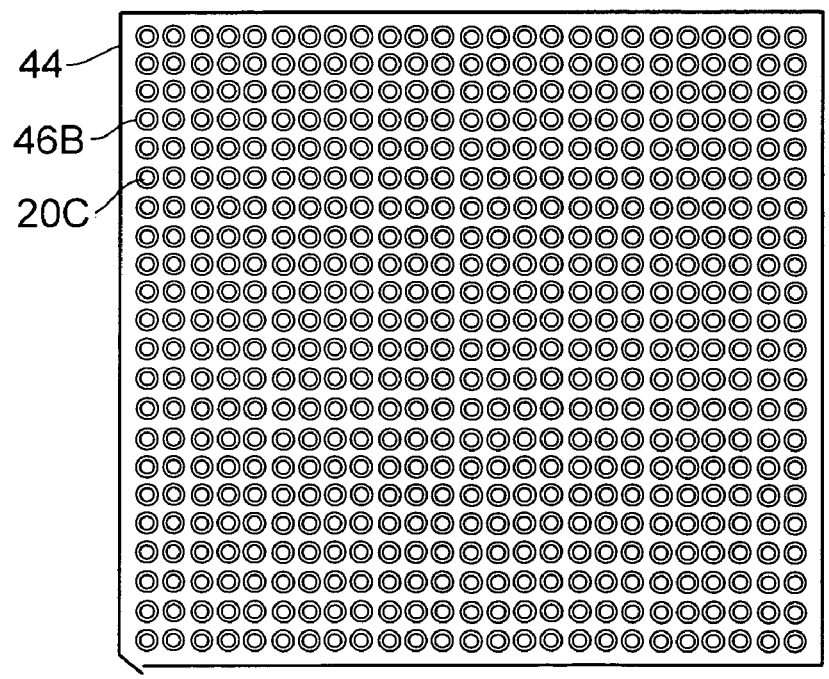
FIG. 6 is a plan view of still another seal member supported by a secondary support member.

Now referring to FIG. 5, in alternate embodiments, the seal member 46 has multiple sections 46A that together define the 22 by 22 array of holes 20C and cover the face of the secondary support member (not shown). Now referring to FIG. 6, in still further embodiments, the seal member has multiple annular sections 46B each of which is located such that a hole 20C extending through the annular section is approximately aligned with one of the holes 20B extending through the secondary support member 44. These alternate embodiments of the seal member 46 further reduce the cumulative physical stresses on the insulative member 16 that occur as the socket terminals 18 are inserted through the holes 20 because the multiple sections 46A, 46B of seal member only contact subsets of the socket terminals.

Although the insulative member 16 and its seal member 46 are shown being used in conjunction with socket terminals with attached solder balls, the insulative member 16 and its seal member 46 are also useful with other assemblies that are attached using reflowable materials (e.g. socket terminals with thru-hole pins, socket terminals attached using solder paste initially placed on the printed circuit board, or socket terminals with solder bumps).

Referring again to FIG. 3, each socket terminal assembly includes a female socket 48 positioned within one of the array of holes 20 of insulative member 16. Female socket 48 includes a solder ball 50 pre-attached (e.g., by soldering) to its bottom end 52 to provide an identical mating condition to surface mount pads 24 as would have been the case had BGA package 12 been connected directly to the printed circuit board 14. Solder balls 50 are eventually soldered to corresponding surface mount pads 24 of circuit board 14. Positioned within the interior of female socket 48 is a contact spring (not shown) press-fit within the interior and upper end of the female socket.

In one exemplary insulative member 16, both the primary support member 40 in the secondary support member 44 are made of a black glass epoxy U.L. rated 94V-0 commercially available as FR4. The seal member 46 is made of a polyimide film commercially available as Kapton. The black glass epoxy of the support members is visually distinct from solder. This is thought to aid in the detection of any solder which passes through the seal member 46.

The seal member more flexible than the support members to allow the seal member to conform to the sides of the socket terminal assemblies 18. Both of the support members 40, 44 and the seal member 46 have square faces with sides approximately 0.906 inch (23.00 millimeters) in length. The primary support member 40 is approximately 0.062 inch (1.575 millimeters) thick, the secondary support member 44 is approximately 0.020 inch (0.508 millimeter) thick, and the seal member 46 is approximately 0.005 inch (0.13 millimeter) thick. A 22 by 22 array of holes 20C is machined in each of the support members 40, 44 and the seal member with a pitch of approximately 0.0394 inch (1 millimeter). In this context, pitch is the distance between the centers of adjacent holes. The holes 20A, 20B, and 20C have diameters of approximately 0.0335 inch (0.851 millimeter), 0.019 inch (0.483 millimeter), and 020 inch (0.508 millimeter), respectively.

In one embodiment, the parts of the intercoupling component 16 are manufactured separately and then assembled. An array of holes 20A is provided extending through the primary support member 40, an array of holes 20B is provided extending through the secondary support member 44, and an array of holes 20C is provided extending through the seal member 46. As described above, the arrays of holes 20A, 20B, and 20C are located in patterns corresponding to the footprint of the surface mount pads 24 of printed circuit board 14 and the stiffness characteristic of the seal member 46 is less than the stiffness characteristic of the secondary support member 44. Electrically conductive elements (e.g. socket terminals 18) configured to electrically connect the array of surface mount pads 24 on the printed circuit board 14 to the array of connection regions of the BGA package 12 are positioned within the holes 20A. The electrically conductive elements are inserted through the holes 20B and 20C such that the seal member 46 is positioned between the primary support member 40 and the secondary support member 44. The holes 20C in the seal member 46 are sized and shaped to restrict fluid flow along the terminal elements.

Providing the holes 20B can include machining (e.g., drilling, stamping, water drilling) the holes 20B to have a first diameter that is equal to or less than a second diameter of the holes 20C. For example, in one embodiment, holes 20B and holes 20C were drilled in the secondary support member 44 and in the seal member 46, respectively.

After the holes 20A, 20B, 20C are machined in the support and seal members, the socket terminals are inserted through the holes 20A, 20B, 20C such that sides of the socket terminals engage with portions of the seal member.

A number of embodiments of the invention have been described. Nevertheless, it will be understood that various modifications may be made without departing from the spirit and scope of the invention. For example, although the exemplary seal 46 is configured as a single sheet whose dimensions approximate the dimensions of the support members, other seals are configured as multiple rectangular sheets or multiple annuli. Similarly, although the illustrative embodiments have 22×22 arrays of holes to receive socket terminals, other numbers and/or configurations of holes and socket terminals could be used in other embodiments. Similarly, in other embodiments, intercoupling components are configured to couple a printed circuit board to a second printed circuit board. Accordingly, other embodiments are within the scope of the following claims.

What is claimed is:

1. An intercoupling component used to couple an array of electrical connection regions disposed on a first substrate to an array of electrical connection regions disposed on a second substrate, the intercoupling component comprising:
   A first insulative support member having a first upper surface and an opposite first lower surface, the first insulative support member including an array of first holes extending transversely from the first upper surface to the opposite first lower surface, the array of first holes located in a pattern corresponding to the array of the electrical connection regions of the first substrate;
   a plurality of electrically conductive terminal elements, disposed within the first holes and configured to electrically connect the array of connection regions of the first substrate to the array of connection regions of the second substrate;
   a second insulative support member having a second upper surface, an opposite second lower surface and a first stiffness characteristic, the second insulative support member including an array of second holes extending transversely from the second upper surface to the opposite second lower surface, the array of second holes receiving the plurality of electrically conductive terminal elements; and
   a seal member positioned between the first insulative support member and the second insulative member, the seal member having a third upper surface, an opposite third lower surface and a second stiffness characteristic less than the first stiffness characteristic of the second insulative support member, the seal member including an array of third holes extending transversely from the third upper surface to the opposite third lower surface, the array of third holes receiving the plurality of electrically conductive terminal elements and sized and shaped to restrict fluid flow along the terminal elements.

2. The intercoupling component of claim 1 wherein each terminal element comprises solder preattached to an end of the terminal element.

3. The intercoupling component of claim 2 wherein the solder comprises a solder ball adapted to be reflowed to connect the terminal element to a corresponding one of the array of connection regions disposed on the second substrate.

4. The intercoupling component of claim 1 wherein the first holes are sized to allow an end of the terminal elements to be press-fit into the first insulative support member.

5. The intercoupling component of claim 1 wherein the seal member is formed of an insulative material.

6. The intercoupling component of claim 1 wherein the seal member is thermally-stable at temperatures below 400 degrees Centigrade.

7. The intercoupling component of claim 1 wherein the seal member is substantially non-porous.

8. The intercoupling component of claim 1 wherein the seal member comprises a polyimide film.

9. The intercoupling component of claim 1 wherein the seal member comprises a plurality of seals.

10. The intercoupling component of claim 9 wherein each of the plurality of seals has an annular shape.

11. The intercoupling component of claim 1 wherein the second holes have a first diameter that is greater than or equal to a second diameter of the third holes.

12. The intercoupling component of claim 11 wherein the first holes have a diameter of less than about 0.020 inch (0.508 millimeters).

13. The intercoupling component of claim 11 wherein the first holes are located with a pitch of between about 0.019 inch (0.500 millimeters) and 0.050 inch (1.27 millimeters).

14. The intercoupling component of claim 1 wherein the first insulative support member has a first thickness that is more than a second thickness of the second insulative support member.

15. The intercoupling component of claim 14 wherein the first thickness is between about 0.025 inch (0.635 mm) and 0.100 inch (2.54 mm).

16. The intercoupling component of claim 15 wherein the second thickness is between about 0.005 inch (0.127 mm) and 0.025 inch (0.635 mm).

17. A method of manufacturing an intercoupling component used to couple an array of electrical connection regions disposed on a first substrate to an array of electrical connection regions disposed on a second substrate, the method comprising:
   providing an array of first holes extending through a first insulative support member, the array of first holes located in a pattern corresponding to the array of the electrical connection regions of the first substrate;
   providing an array of second holes extending through a second insulative support member having a first stiffness characteristic, the array of second holes located in a pattern corresponding to the array of the electrical connection regions of the first substrate;
   providing an array of third holes extending through a seal member, the seal member having a second stiffness characteristic less than the first stiffness characteristic of the second insulative support member,
   positioning electrically conductive terminal elements within the first holes, the electrically conductive terminal elements configured to electrically connect the array of connection regions of the first substrate to the array of connection regions of the second substrate; and
   inserting the terminal elements through the third holes and the second holes such that the seal member is positioned between the first insulative support member and the second insulative member with the array of third holes sized and shaped to restrict fluid flow along the terminal elements.

18. The method of claim 17 wherein providing the second holes comprises machining the third holes to have a first diameter that is equal to or less than a second diameter of the second holes.

19. The method of claim 18 wherein machining the third holes comprises machining the third holes to have a first diameter of less than about 0.020 inch (0.508 mm).

20. The method of claim 17 wherein the seal member comprises a plurality of seals, each seal having third holes corresponding to a subset of the first holes.

21. The method of claim 20 further comprising forming each of the seals with an annular shape.

22. The method of claim 17 wherein the first insulative support member comprises a first epoxy impregnated laminates with a first thickness and the second insulative support member comprises a second epoxy impregnated laminates with a second thickness that is less than the first thickness.

23. The method of claim 22 wherein the second thickness is between about 0.005 inch (0.127 mm) and 0.025 inch (0.635 mm).

24. The method of claim 22 wherein providing the array of third holes comprises drilling holes extending through a polyimide film.

25. The method of claim 24 inserting the terminal elements through the third holes comprises engaging sides of the terminal elements with portions of the seal member defining the third holes.

26. The method of claim 24 wherein the polyimide film has a third thickness that is between about 0.004 inch (0.102 mm) and 0.006 inch (0.152 mm).

* * * * *